(12) United States Patent
Yokotani

(10) Patent No.: US 11,566,648 B2
(45) Date of Patent: Jan. 31, 2023

(54) SEAL COVER

(71) Applicant: Sumitomo Wiring Systems, Ltd., Mie (JP)

(72) Inventor: Koichi Yokotani, Mie (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 1296 days.

(21) Appl. No.: 15/776,459

(22) PCT Filed: Oct. 27, 2016

(86) PCT No.: PCT/JP2016/081872
§ 371 (c)(1),
(2) Date: May 16, 2018

(87) PCT Pub. No.: WO2017/086117
PCT Pub. Date: May 26, 2017

(65) Prior Publication Data
US 2018/0328391 A1 Nov. 15, 2018

(30) Foreign Application Priority Data
Nov. 17, 2015 (JP) .............................. JP2015-224732

(51) Int. Cl.
*F16B 5/06* (2006.01)
*F16J 13/02* (2006.01)
(Continued)

(52) U.S. Cl.
CPC ................. *F16B 5/06* (2013.01); *F16B 5/07* (2013.01); *F16J 13/02* (2013.01); *F16J 13/14* (2013.01);
(Continued)

(58) Field of Classification Search
CPC ...... F16B 5/06; F16B 5/07; F16J 13/02; F16J 13/14; F16J 15/10; H05K 5/0247; H05K 5/03; H05K 5/069; H05K 7/1432
See application file for complete search history.

(56) References Cited

U.S. PATENT DOCUMENTS 3,965,952 A * 6/1976 Rivman ............. A44B 17/0029
2/265
6,009,603 A * 1/2000 Gallagher .......... B65D 33/2541
24/585.12
(Continued)

FOREIGN PATENT DOCUMENTS

JP 60-35409 3/1985
JP 6-63402 9/1994
(Continued)

OTHER PUBLICATIONS

International Search Report dated Jan. 10, 2017.

*Primary Examiner* — David M Upchurch
(74) *Attorney, Agent, or Firm* — Gerald E. Hespos; Michael J. Porco

(57) ABSTRACT

A seal cover for closing an annular opening portion having locking projections provided on an outer peripheral surface includes a fitting portion having a seal ring (example of a sealing member) fit on an outer peripheral surface and locking portions configured to be pushed and resiliently deformed by the locking projections and move over the locking projections to be locked to the locking projections when the fitting portion is fit into the opening portion. Tapered surfaces for delaying a time point when the locking portions are maximally resiliently deformed from a time point when the seal ring is maximally compressed when the fitting portion is fit and inserted into the opening portion are formed on front end parts of the locking portions in a connecting direction.

8 Claims, 8 Drawing Sheets

(51) Int. Cl.
*F16J 15/10* (2006.01)
*H05K 5/06* (2006.01)
*F16J 13/14* (2006.01)
*H05K 5/02* (2006.01)
*H05K 7/14* (2006.01)
*F16B 5/07* (2006.01)
*H05K 5/03* (2006.01)

(52) U.S. Cl.
CPC ............ *F16J 15/10* (2013.01); *H05K 5/0247* (2013.01); *H05K 5/03* (2013.01); *H05K 5/069* (2013.01); *H05K 7/1432* (2013.01)

(56) References Cited

U.S. PATENT DOCUMENTS

| | | | |
|---|---|---|---|
| 2012/0285718 A1 | 11/2012 | Sakakura | |
| 2015/0201505 A1* | 7/2015 | Hu | H05K 5/0013 |
| | | | 312/223.1 |
| 2018/0048132 A1* | 2/2018 | Dinh | H02G 3/081 |

FOREIGN PATENT DOCUMENTS

| | | |
|---|---|---|
| JP | 2002-61618 | 2/2002 |
| JP | 2012-238422 | 12/2012 |

* cited by examiner

SEAL COVER

BACKGROUND

Field of the Invention

This specification relates to a seal cover for closing an annular opening portion.

Description of the Related Art

Japanese Unexamined Patent Publication No. 2012-238422 discloses a seal cover for closing an annular opening. The seal cover includes a lid for closing the opening and a fitting on the back side of the lid for fitting into the opening. A resin sealing member is on an outer peripheral surface of the fitting and can be compressed and held in close contact with the inner peripheral surface of the opening.

Specifically, the seal cover described in Japanese Unexamined Patent Publication No. 2012-238422 includes a cover body to be mounted on a surface of a case and a ring holding member (equivalent to a fitting) disposed to fit into an annular opening on a back surface side of the cover body. A seal ring (equivalent to a sealing member) is fit on an outer peripheral surface of the ring holding member for closely contacting the inner peripheral surface of the opening.

To suppress the detachment of the seal cover mounted on the opening, it is conceivable to provide a locking projection on the outer peripheral surface of the opening and to provide a resiliently deformable locking portion extending forward in a connecting direction from the lid. Thus, the locking portion will deform resiliently and lock to the locking projection when the fitting is fit and inserted into the opening.

However, in such a case, if a time point when the sealing member is maximally compressed (in other words, time point when the compression of the sealing member reaches a maximum state from a non-maximum state) and a time point when the locking portion is maximally resiliently deformed (in other words, time point when the resilient deformation of the locking portion reaches a maximum state from a non-maximum state) overlap when the seal cover is mounted on the opening portion, a large force is necessary to mount the seal cover, thereby increasing a burden of a worker.

The overlap of those two time points can be prevented if the position of the locking portion in the connecting direction is displaced. However, there are some cases where the position of the locking portion cannot be displaced due to design restrictions.

This specification disclosed a seal cover that reduces a burden of a worker in mounting a seal cover on an opening portion without displacing relative positions of a sealing member and a locking portion in a connecting direction.

SUMMARY

A seal cover is provided for closing an annular opening portion having a locking projection provided on an outer peripheral surface. The seal cover includes a lid for covering the opening portion. A fitting is disposed on a back surface of the lid and is configured for fitting into the opening portion. A sealing member made of resin is fit on an outer peripheral surface of the fitting and is configured to be compressed and held in close contact with an inner peripheral surface of the opening. A locking portion extends forward in a connecting direction from the lid outside the fitting. The locking portion is pushed by the locking projection to be resiliently deformed and moves over the locking projection to be locked to the locking projection when the fitting is fit into the opening portion A tapered surface is formed on a front end part of the locking portion in the connecting direction for delaying a time point when the locking portion is maximally resiliently deformed from a time point when the sealing member is maximally compressed when the fitting is fit and inserted into the opening. Accordingly, since the time point when the locking portion is maximally resiliently deformed and the time point when the sealing member is maximally compressed do not overlap, a force necessary when a worker mounts the seal cover can be reduced as compared to the case where those two time points overlap.

The two time points of the above-described seal cover are made not to overlap by providing the tapered surface on the locking portion. Thus, when the position of the locking portion in the connecting direction cannot be displaced due to design restrictions, those two time points can be made not to overlap without displacing the position of the locking portion.

Therefore, according to the above-described seal cover, a burden of the worker in mounting the seal cover on the opening portion can be reduced without displacing relative positions of the sealing member and the locking portion in the connecting direction.

Further, the tapered surface may be a flat slope formed on a corner between a surface of the locking portion facing toward the fitting and an end surface of the locking portion facing forward in the connecting direction. Accordingly, the flat slope of the tapered surface enables the locking portion to move smoothly over the locking projection.

According to the seal cover disclosed in this specification, it is possible to reduce a burden of a worker in mounting a seal cover on an opening portion without displacing relative positions of a sealing member and a locking portion in a connecting direction.

DETAILED DESCRIPTION

An embodiment is described with reference to FIGS. 1 to 8. In the following description, a front-rear direction and a lateral direction are based on a front-rear direction and a lateral direction shown in FIG. 1, and a vertical direction is based on a vertical direction shown in FIG. 3.

Figure 1:
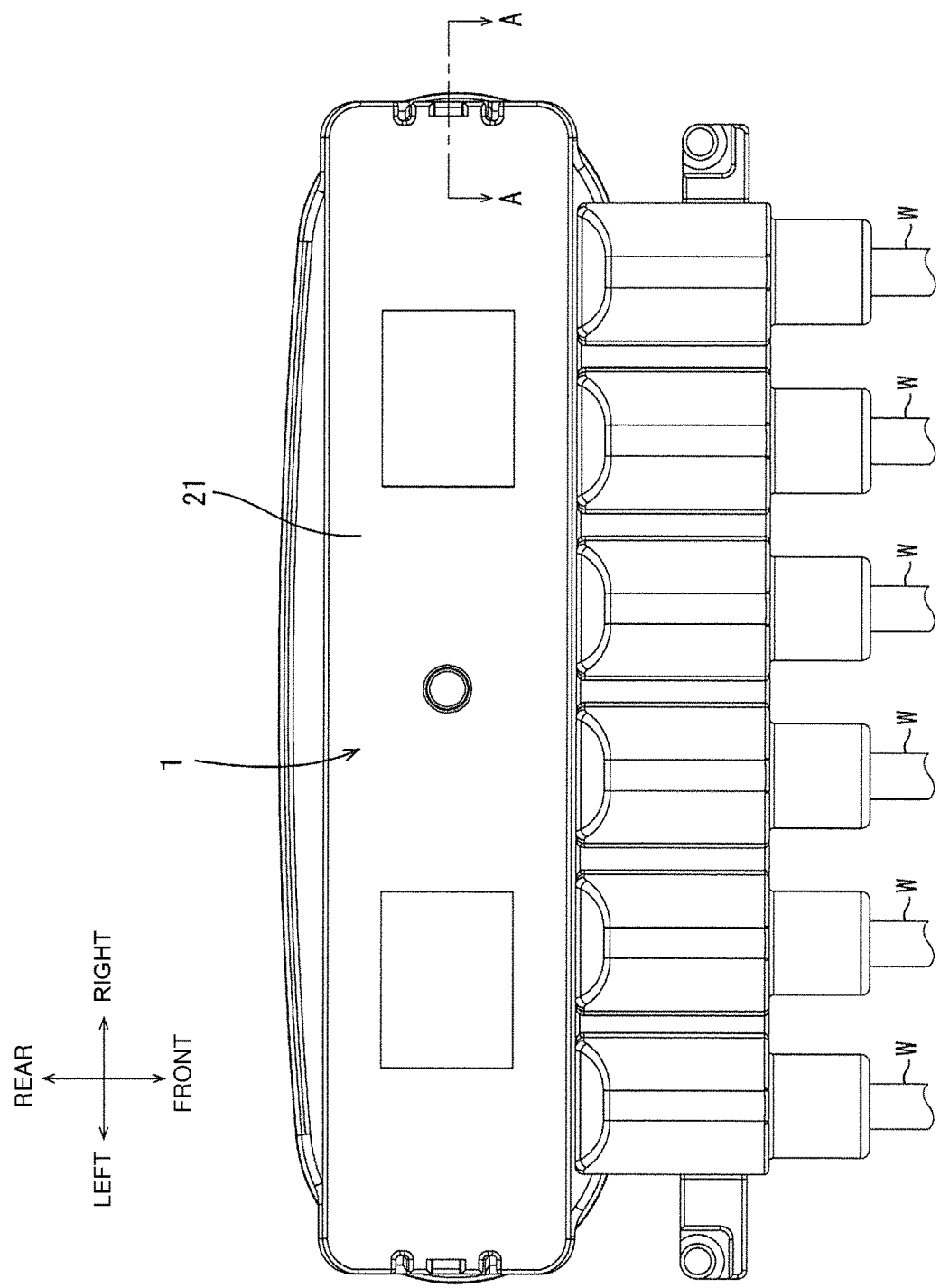
FIG. 1 is a top view showing a state where a seal cover according to an embodiment is mounted on an annular opening portion.

First, an outline of a seal cover 1 according to this embodiment is described with reference to FIG. 1. The seal cover 1 is for closing an annular opening 10 (see FIGS. 2 and 3) provided in a case that accommodates an inverter installed in a vehicle, such as an electric or hybrid vehicle.

(1) Opening Portion

Figure 2:
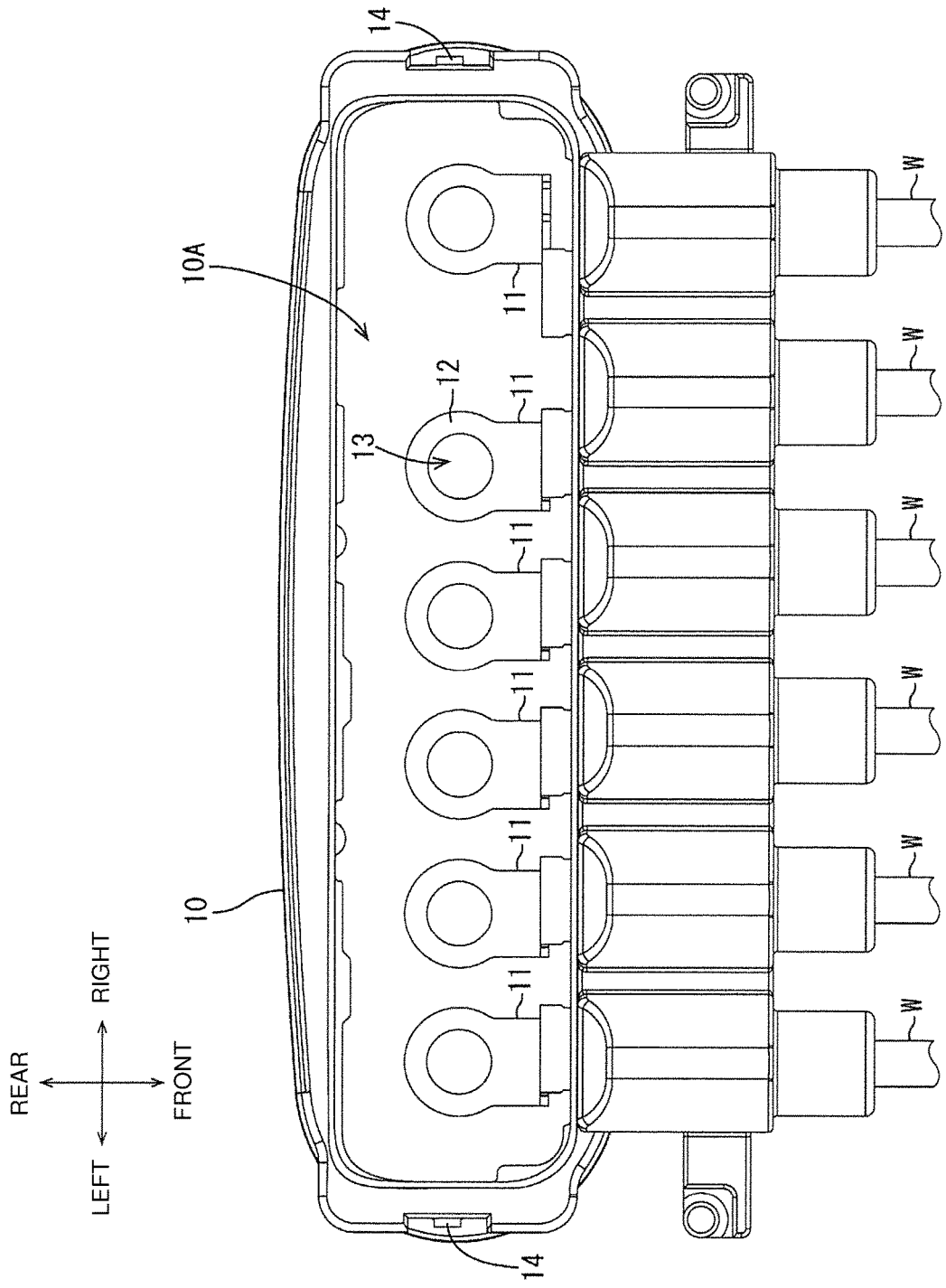
FIG. 2 is a top view of the annular opening portion.

The annular opening portion 10 is first described with reference to FIGS. 2 and 3. As shown in FIG. 2, the opening portion 10 is a member made of resin and constituted by a substantially rectangular wall and is open on both upper and lower sides. An opening is provided in a case of an unillustrated inverter. The opening portion 10 is mounted on the case to surround the opening. Six terminal bolts are provided on the case of the inverter to project up. When the opening portion 10 is mounted on the case, those six terminal bolts project into the inside of the opening portion 10 through a lower opening of the opening portion 10.

Six wires W are integrated with the opening portion 10 by molding while penetrating through the annular wall constituting the opening portion 10 in the front-rear direction. Each wire W has a terminal fitting 11 connected to a core of a tip part thereof and the other end part thereof is connected to an unillustrated three-phase motor (or battery).

The terminal fitting 11 includes a contact portion 12 in the form of a substantially circular plate with a through hole 13 penetrating in a plate thickness direction. The terminal fitting 11 is fixed to the aforementioned terminal bolt by inserting the terminal bolt into the through hole 13 and threadably engaging a nut with the terminal bolt in that state.

Figure 3:
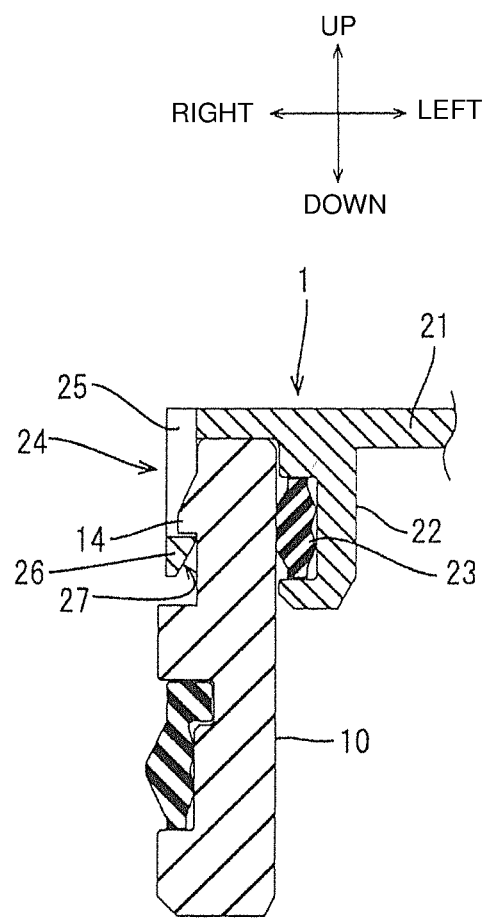
FIG. 3 is a section along A-A of FIG. 1 of the seal cover and the opening portion.

Further, as shown in FIGS. 2 and 3, locking projections 14 are formed integrally on both left and right sides of the outer peripheral surface of the opening portion 10. As shown in FIG. 3, the locking projection 14 has a downwardly facing end surface and a tapered surface inclined inwardly of the opening portion 10 toward the top.

(2) Configuration of Seal Cover

Figure 4:
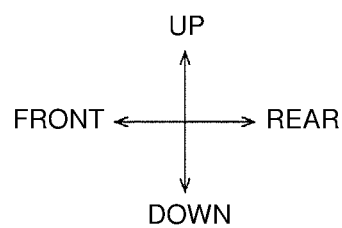
FIG. 4 is a side view of a locking projection and a locking portion.
Figure 4:
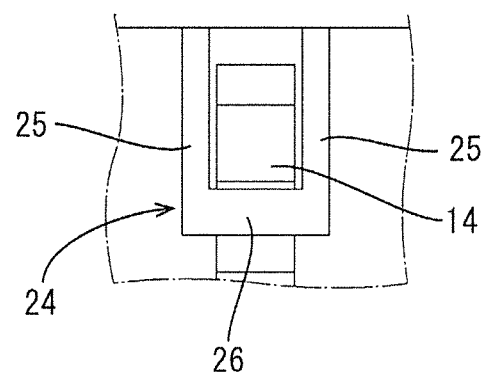

The configuration of the seal cover 1 is described with reference to FIGS. 3 and 4. The seal cover 1 also is made of resin and includes a lid 21 shown in FIG. 1 and a fitting 22 shown in FIG. 3. The lid 21 is a plate-like member for closing an upper opening 10A (see FIG. 2) of the opening portion 10 and is formed into a rectangular shape when viewed from above, as shown in FIG. 1.

As shown in FIG. 3, the fitting 22 is disposed to fit into the opening portion 10 on a back surface side of the lid 21. A recess is formed on the outer peripheral surface of the fitting 22 over the entire circumference and a seal ring 23 (example of a sealing member) made of synthetic resin is fit in that recess. When the fitting 22 is fit and inserted into the opening portion 10, the seal ring 23 is compressed and held in close contact with the inner peripheral surface of the opening portion 10, thereby sealing between the fitting 22 and the opening portion 10 in a watertight manner.

Further, resiliently deformable locking portions 24 are formed integrally to the lid portion 21 outside the fitting 22 and extend down in a connecting direction. As shown in FIG. 4, the locking portion 24 includes two lock arms 25 extending down while being spaced in the front-rear direction, and a locking piece 26 connecting tips of the lock arms 25. An interval between the lock arms 25 in the front-rear direction substantially matches a width of the locking projection 14 in the front-rear direction.

As shown in FIG. 3, a tapered surface 27 is formed on a lower end part of the locking portion 24. The tapered surface 27 is a flat slope formed by chamfering a corner part between a surface of the locking piece 26 facing toward the fitting 22 and an end surface of the locking piece 26 facing down.

(3) Mounting of Seal Cover

Figure 5:
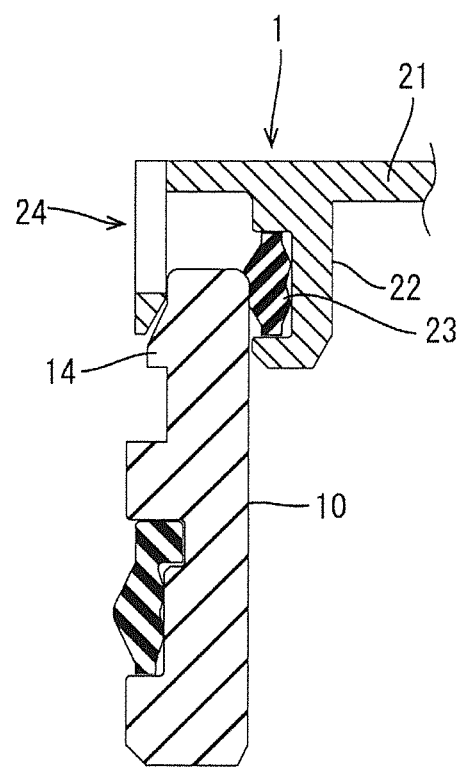
FIG. 5 is a section of the seal cover and the opening portion in mounting the seal cover.
Figure 6:
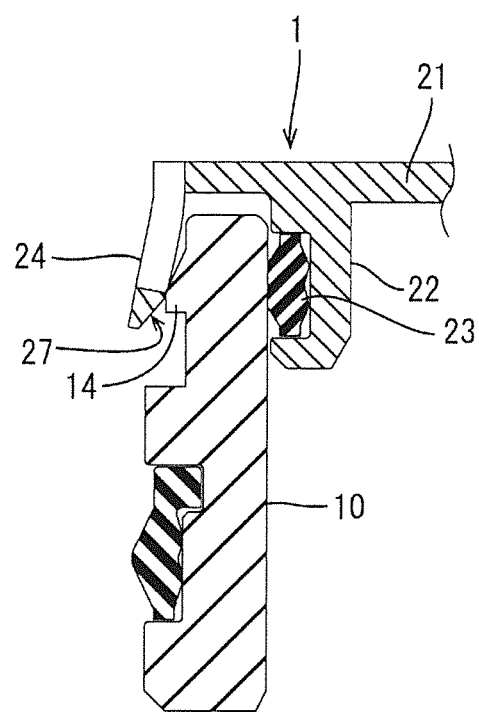
FIG. 6 is a section of the seal cover and the opening portion in mounting the seal cover.

First, a state of mounting the seal cover 1 on the opening portion 10 is described in a chronological order with reference to FIGS. 3, 5 and 6.

When the fitting 22 of the seal cover 1 is fit and inserted into the opening portion 10 by a worker, as shown in FIG. 5, the seal ring 23 is pressed against the inner peripheral surface of the opening portion 10 to be compressed. FIG. 5 shows a state at a time point when the seal ring 23 is maximally compressed and this time point is referred to as a time point T1 in the following description.

When the seal cover 1 is pushed father, as shown in FIG. 6, the tapered surfaces 27 of the locking portions 24 are pushed by the locking projections 14 to resiliently deform the locking portions 24. FIG. 6 shows a state at a time point when the locking portions 24 are maximally resiliently deformed and this time point is referred to as a time point T2 in the following description.

When the seal cover 1 is pushed farther, as shown in FIG. 3, the locking pieces 26 move over the locking projections 14 to be locked to the locking projections 14. In this way, the seal cover 1 and the opening portion 10 are locked.

As just described, in the seal cover 1 according to this embodiment, the time point T2 (time point shown in FIG. 6) when the locking portions 24 are maximally resiliently deformed is later than the time point T1 (time point shown in FIG. 5) when the seal ring 23 is maximally compressed since the locking portions 24 are formed with the tapered surfaces 27. Specifically, the time point T2 when the locking portions 24 are maximally resiliently deformed and the time point T1 when the seal ring 23 is maximally compressed do not overlap.

Figure 7:
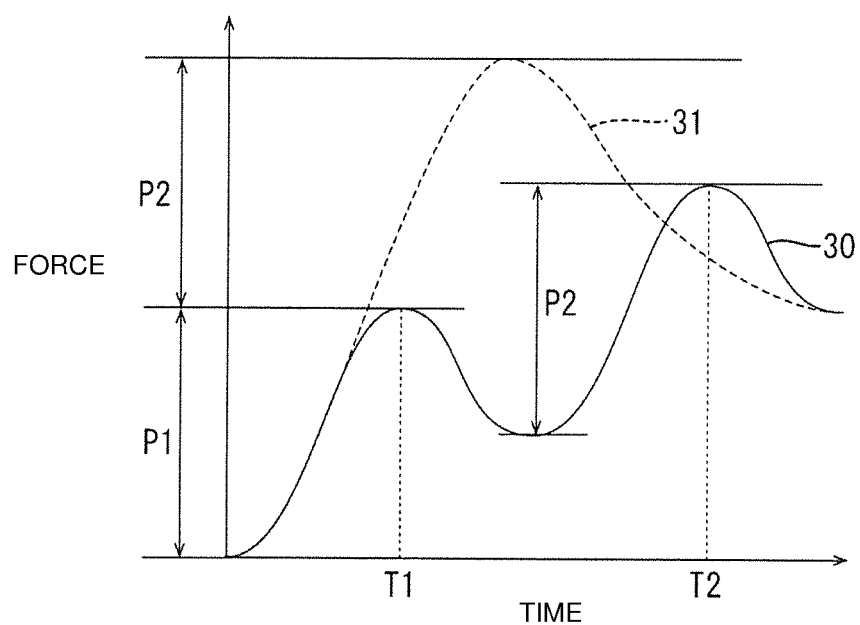
FIG. 7 is a graph showing a change of a force in mounting the seal cover.

Next, a change of a force when the worker mounts the seal cover 1 is described with reference to FIG. 7. In FIG. 7, a solid line 30 shows a change of a force when the worker mounts the seal cover 1. Note that FIG. 7 is for conceptually describing the change of the force when the seal cover 1 is mounted and does not show a result of actual measurement of the force when the seal cover 1 is mounted. Thus, the change of the force when the seal cover 1 actually is mounted does not necessarily match that of FIG. 7.

As shown by the solid line 30, the force when the worker mounts the seal cover 1 temporarily decreases after becoming maximum at the time point T1 when the seal ring 23 is compressed maximally. The same applies also to the time point T2. The force when the seal cover 1 is mounted temporarily decreases after becoming maximum at the time point TP2 when the locking portions 24 are maximally resiliently deformed.

For example, it is assumed that P1 denotes a force when the seal ring 23 is compressed maximally at the time point T1 and P2 denotes a difference between a force temporarily decreased and becoming minimum after the time point T1 and a force becoming maximum at the time point T2. In the seal cover 1, a force required when the worker mounts the seal cover 1 on the opening portion 10 is maximized when the locking portions 24 are maximally resiliently deformed at the time point T2 and the force at that time is smaller than the sum of P1 and P2.

Next, a force of a change in mounting a seal cover 100 (hereinafter, referred to as the seal cover 100 according to a comparative example) obtained by forming the locking portions 24 of the seal cover 1 according to this embodiment with no tapered surface 27 is described with reference to FIGS. 7 and 8.

Figure 8:
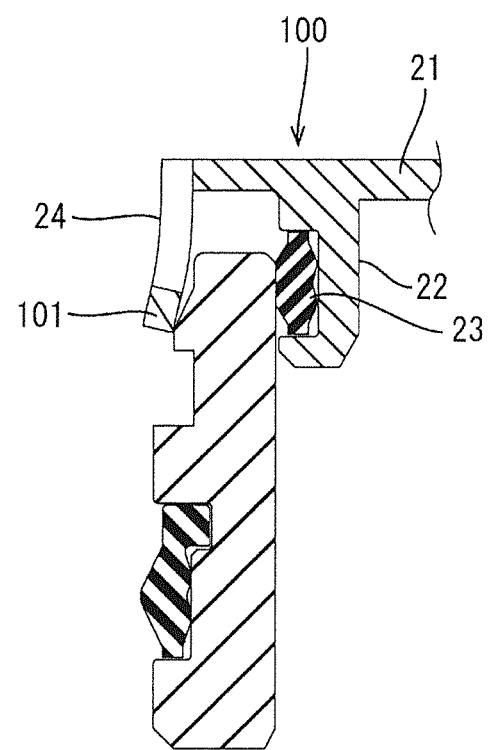
FIG. 8 is a section of a seal cover according to a comparative example and an opening portion in mounting the seal cover.

In the seal cover 100 according to the comparative example, a locking piece 101 is not provided with a tapered surface as shown in FIG. 8 and a time point when a seal ring 23 is compressed maximally and a time point when locking portions 24 are maximally resiliently deformed substantially overlap. As shown by a dotted line of FIG. 7, if the time point when the seal ring 23 is compressed maximally and the time point when the locking portions 24 are maximally resiliently deformed substantially overlap, a maximum force necessary when a worker mounts the seal cover 100 on the opening portion 10 is substantially equal to the sum of P1 and P2.

Specifically, if the aforementioned two time points T1, T2 overlap, the maximum force necessary when the worker mounts the seal cover 100 on the opening portion 10 is larger as compared to the case where those two time points do not overlap. Conversely, if the aforementioned two time points do not overlap, the maximum force necessary when the worker mounts the seal cover 1 on the opening portion 10 can be reduced as compared to the case where those two time points overlap.

(4) Effects of Embodiment

According to the seal cover 1 relating to the embodiment described above, the tapered surfaces 27 for delaying the time point T2 when the locking portions 24 are maximally resiliently deformed from the time point T1 when the seal ring 23 is maximally compressed are formed on the lower end parts of the locking portions 24. Thus, the time point T2 when the locking portions 24 are maximally resiliently deformed and the time point T1 when the seal ring 23 is compressed maximally do not overlap. Therefore, a force necessary when the worker mounts the seal cover 1 on the opening portion 10 can be reduced as compared to the case where those two time points overlap.

Further, those two time points are made not to overlap by providing the tapered surfaces 27 on the locking portions 24 according to the seal cover 1. Thus, when the positions of the locking portions 24 in the connecting direction cannot be displaced due to design restrictions, the two time points can be made not to overlap without displacing the positions of the locking portions 24.

Therefore, according to the seal cover 1, a burden of the worker in mounting the seal cover 1 on the opening portion 10 can be reduced without displacing relative positions of the seal ring 23 and the locking portions 24 in the connecting direction.

Further, according to the seal cover 1, the tapered surface is a flat slope formed on the corner part between the surface of the locking portion 24 facing toward the fitting portion 22 and the end surface of the locking portion 24 facing forward in the connecting direction. Thus, a force changes at a fixed rate and the locking portion 24 can smoothly move over the locking projection 14 as compared to the case where the tapered surface is, for example, arcuately curved.

OTHER EMBODIMENTS

The invention is not limited to the above described and illustrated embodiment. For example, the following embodiments also are included in the technical scope disclosed in this specification.

Although a case where the tapered surface is a flat slope has been described in the above embodiment, the tapered surface is not limited to the flat slope if the tapered surface is shaped such that the time point when the locking portion 24 is maximally resiliently deformed can be delayed from the time point when the seal ring 23 is maximally compressed. For example, the tapered surface may have an arcuately curved shape.

Although a case where the locking portion 24 includes the pair of lock arms 25 has been described in the above embodiment, only one lock arm may be provided.

LIST OF REFERENCE SIGNS

1 . . . seal cover
10 . . . opening portion
10A . . . opening
22 . . . fitting
23 . . . seal ring (example of sealing member)
24 . . . locking portion
27 . . . tapered surface

The invention claimed is:

1. A seal cover for closing an annular opening portion having a locking projection provided on an outer peripheral surface, comprising:
   a lid for covering an opening of the opening portion;
   a fitting formed integrally with the lid and disposed on a back surface of the lid, the fitting extending forward in a connecting direction of the seal cover with the opening portion and being configured to fit into the opening portion
   a locking portion formed integrally with the lid and extending forward in the connecting direction from the lid outside the fitting, the locking portion being pushed by the locking projection to be resiliently deformed and moving over the locking projection to be locked to the locking projection when the fitting is fit into the opening portion; and
   a sealing member made of resin and being formed separately from the lid, the fitting and the locking portion, the sealing member being fit on an outer peripheral surface of the fitting at a position opposed to the locking portion in a direction transverse to the connecting direction and being configured to be compressed and held in close contact with an inner peripheral surface of the opening portion, wherein
   a tapered surface is formed on a front end part of the locking portion and farthest from the lid in the connecting direction for delaying a time point when the locking portion is maximally resiliently deformed from a time point when the sealing member is compressed maximally when the fitting is fit and inserted into the opening portion.

2. The seal cover of claim 1, wherein the tapered surface is a flat slope formed on a corner part between a surface of the locking portion facing toward the fitting and an end surface of the locking portion facing forward in the connecting direction.

3. The seal cover of claim 1, wherein a distance from the sealing member to the lid is less that a distance from the tapered surface of the locking portion to the lid.

4. The seal cover of claim 1, wherein the locking portion has a locking surface at an end of the tapered surface closest to the lid and extending away from the sealing member in the direction transverse to the connecting direction.

5. A sealing and locking assembly, comprising:

an annular portion having an opening and an outer peripheral surface outward of the opening, a locking projection projecting out on the outer peripheral surface of the annular portion;

a cover formed integrally of a resin and including: a lid for covering the opening of the annular portion, a fitting disposed on a back surface of the lid, the fitting extending forward in a connecting direction of the cover with the opening of the annular portion, the fitting being configured to fit into the opening portion, a locking portion extending forward in the connecting direction from the lid at a position outside the fitting, the locking portion being pushed by the locking projection to be resiliently deformed and moving over the locking projection to be locked to the locking projection when the fitting is fit into the opening; and a sealing member made of resin and being fit on an outer peripheral surface of the fitting at a position opposed to the locking portion in a direction transverse to the connecting direction and being configured to be compressed and held in close contact with an inner peripheral surface of the annular portion, wherein a tapered surface is formed on a front end part of the locking portion and farthest from the lid in the connecting direction for delaying a time point when the locking portion is maximally resiliently deformed from a time point when the sealing member is compressed maximally when the fitting is fit and inserted into the opening portion.

6. The sealing and locking assembly of claim 5, wherein the tapered surface is a flat slope formed on a corner part between a surface of the locking portion facing toward the fitting and an end surface of the locking portion facing forward in the connecting direction.

7. The sealing and locking assembly of claim 5, wherein a distance from the sealing member to the lid is less that a distance from the tapered surface of the locking portion to the lid.

8. The sealing and locking assembly of claim 5, wherein the locking portion has a locking surface at an end of the tapered surface closest to the lid and extending away from the sealing member in the direction transverse to the connecting direction.

\* \* \* \* \*